United States Patent
Nadeau-Dostie et al.

(10) Patent No.: US 7,257,733 B2
(45) Date of Patent: Aug. 14, 2007

(54) MEMORY REPAIR CIRCUIT AND METHOD

(75) Inventors: Benoit Nadeau-Dostie, Gatineau (CA); Saman M. I. Adham, Kanata (CA)

(73) Assignee: LogicVision, Inc., San Jose, CA (US)

(*) Notice: Subject to any disclaimer, the term of this patent is extended or adjusted under 35 U.S.C. 154(b) by 513 days.

(21) Appl. No.: 10/868,208

(22) Filed: Jun. 16, 2004

(65) Prior Publication Data
US 2004/0257901 A1    Dec. 23, 2004

Related U.S. Application Data

(60) Provisional application No. 60/479,229, filed on Jun. 18, 2003.

(51) Int. Cl.
*G06F 11/00* (2006.01)

(52) U.S. Cl. .................. 714/8; 714/710; 714/711

(58) Field of Classification Search .............. 714/8, 714/710, 711
See application file for complete search history.

(56) References Cited

U.S. PATENT DOCUMENTS

| | | | |
|---|---|---|---|
| 6,052,798 A * | 4/2000 | Jeddeloh .................. | 714/8 |
| 6,065,134 A * | 5/2000 | Bair et al. ................ | 714/7 |
| 6,246,618 B1 * | 6/2001 | Yamamoto et al. ......... | 365/200 |
| 6,366,508 B1 | 4/2002 | Agrawal et al. | |
| 6,374,370 B1 * | 4/2002 | Bockhaus et al. ............ | 714/39 |
| 6,462,995 B2 | 10/2002 | Urakawa | |
| 6,507,524 B1 | 1/2003 | Agrawal et al. | |
| 6,667,918 B2 | 12/2003 | Leader et al. | |
| 6,728,910 B1 * | 4/2004 | Huang .................. | 714/711 |
| 6,928,591 B2 * | 8/2005 | Grinchuk et al. ........... | 714/710 |
| 2004/0117694 A1 * | 6/2004 | Howlett .................. | 714/710 |
| 2004/0205427 A1 * | 10/2004 | Ichikawa .................. | 714/710 |
| 2004/0237009 A1 * | 11/2004 | Tester .................... | 714/710 |

* cited by examiner

*Primary Examiner*—Michael Maskulinski
(74) *Attorney, Agent, or Firm*—Eugene E. Proulx

(57) ABSTRACT

A self-repair circuit for a semiconductor memory provides input and output test selectors coupled to respective data bit group inputs and outputs, respectively and input and output repair selectors coupled between the input and output test selectors and functional inputs and functional outputs, respectively. This arrangement allows all data bit groups to be tested in one pass and all test and repair selector circuitry to be tested.

18 Claims, 5 Drawing Sheets

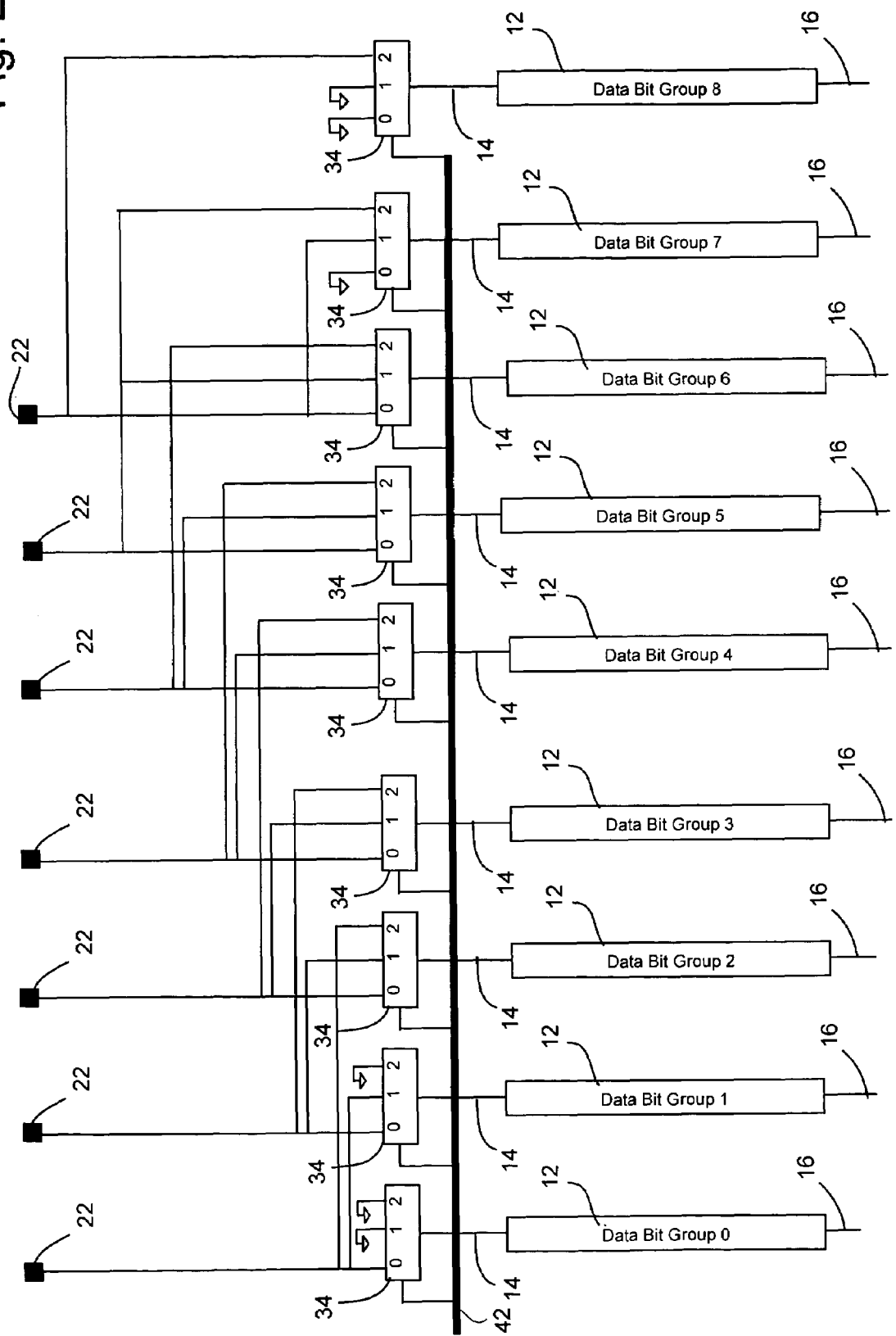

MEMORY REPAIR CIRCUIT AND METHOD

CROSS-REFERENCE TO RELATED APPLICATIONS

This application claims the benefit of U.S. Provisional Patent Application Ser. No. 60/479,229 filed Jun. 18, 2003.

BACKGROUND OF THE INVENTION

1. Field of the Invention

The present invention generally relates to semiconductor memory and, more specifically, to repair and testing of semiconductor memory.

2. Description of Related Art

Semiconductor memory stores data bits organized into rows and columns. Several bits are accessed as a word via functional inputs and outputs. All bits that are accessible via a functional input/output (or I/O) pair is a data bit group.

It is known to provide memory self-repair mechanisms. A typical memory repair method consists of using repair selectors to replace defective data bit groups by defect-free data bit groups. Repair selectors can be implemented as part of the memory (see, for example, Agrawal et al. U.S. Pat. No. 6,507,524 (I/O shifting) and U.S. Pat. No. 6,366,508 (I/O substitution)) or located outside of the memory in a collar so that repair can even be performed on a memory that was not initially designed to support repair. In this case, the designer simply needs to generate a memory with more data bit groups than are needed in functional mode and adding the repair selectors in a collar. This approach is especially useful when the memory is to be made fault-tolerant and repairable in the field because of a latent defect that could not be detected during manufacturing. This fault-tolerance capability requires the capability to change the control signals of the repair selectors after manufacturing.

Many memories with built-in repair support require special equipment, only available at manufacturing time, to permanently program the repair selector control signals. When repair selectors are implemented in a collar external to the memory, the control signals can be re-programmed after manufacturing, but the programming is not permanent. This means that the memory must be tested and the control signals re-programmed each time the circuit containing the semiconductor memory is powered up.

There are two main I/O repair methods. One method is referred to as I/O shifting and the other as I/O substitution. In I/O shifting, the functional input to a defective data bit group is re-directed to the input of the first non-defective neighboring data bit group and the output of the non-defective neighboring data bit group is re-directed to the functional output previously driven by the defective data bit group. The functional input originally connected to the neighboring data bit group is itself re-directed to the input of another non-defective neighboring data bit group and so on. The I/O substitution method redirects the functional input originally connected to a defective data bit group to an identified redundant data bit group. The output of the redundant data bit group is connected to the corresponding functional output. Both methods have advantages and disadvantages that are known to the person skilled in the art.

Both I/O repair methods require running a memory test twice. The first pass is to test the non-redundant data bit groups. Based on the test results, the control signals of the repair selectors are set. Then the memory is tested again to test the repaired memory. There are a number of issues with these methods. First, the two-passes memory test needs leads to longer test times. Second, subtle defects (e.g. bit-line coupling) between data bit groups are not completely covered since only a subset of the data bit groups is exercised during the first and second pass leading to potential quality problems. Third, for applications requiring fault tolerance in the field, the repair logic, including the repair selectors, is not completely tested such that it might not be possible to use a spare data bit group. In addition, when self-repair is implemented, the circuit deriving the control signals of the repair selectors from the test results can be very large.

Huang U.S. Pat. Nos. 6,728,910 and 6,691,264 suggests testing all rows, including redundant rows, of a memory to improve the defect coverage of the memory, but the test and repair still require two passes of the memory test and the coverage of the repair logic is incomplete. Huang is concerned with memories having spare rows and does not address I/O repair methods.

Leader et al. U.S. Pat. No. 6,667,918 suggests a method to repair a memory which is tested by a BIST controller that only provides a binary pass/fail indicator. The repair circuit must then apply several repair configurations and re-test the memory until the binary pass/fail indicates that there are no failures. This method requires extremely long test times.

The foregoing drawbacks are sufficiently significant to justify the development of a new method that would only require a single test pass of the memory test such that test time is reduced. This method should provide a more thorough test of all data bit groups and of their interaction. It should also allow a complete test of the repair logic so that modification of the repair configuration is possible in the field and the circuit deriving the control signals of the repair selectors from the test results should be as small as possible.

SUMMARY OF THE INVENTION

The present invention seeks to provide a method and semiconductor memory array collar circuit for repairing defective memory while providing higher test coverage of both the memory array and repair circuitry. The method covers additional coupling faults in an array with spare cells and the repair circuitry is completely tested as part of a scan test process. Non-repairable memories are identified in a single test step as opposed to two test steps, reducing test time. The present invention can be applied to any conventional memory designed without any repair-specific circuitry.

One aspect of the present invention is generally defined as a method of repairing a semiconductor memory having a number of data bit groups greater than that required to store functional data words so as to provide one or more redundant data bit groups for repairing the memory, each data bit group having a data input and a data output, and non-redundant data bit groups having a default functional input and a default functional output, the method comprising performing a memory test of all data bit groups in the memory to identify all data bit groups having at least one defective data bit; storing a test result for each data bit group; and selecting a functional input and a functional output for each data bit group based on the test results and a functional input and output index (I/O index).

The present invention allows a complete test of the repair logic so that modification of the repair configuration is possible in the field. Also, when self-repair is implemented, the circuit deriving the control signals of the repair selectors from the test results is very compact.

Another aspect of the present invention is generally defined as self-repair circuit for a semiconductor memory having a number of data bit groups greater than that required to store functional data words to provide redundant data bit groups for repairing said memory, each data bit group having a data input and a data output, and non-redundant data bit groups having a default functional input and a default functional output, said circuit comprising input and output test selectors coupled to respective data bit group inputs and outputs, respectively; and input and output repair selectors coupled between said input and output test selectors and functional inputs and functional outputs, respectively.

BRIEF DESCRIPTION OF THE DRAWINGS

These and other features of the invention will become more apparent from the following description in which reference is made to the appended drawings in which:

FIG. 2 is a diagrammatic view, similar to FIG. 1, of a semiconductor memory array having two redundant data bit groups and a memory collar according to the embodiment of FIG. 1;

DETAILED DESCRIPTION OF PREFERRED EMBODIMENTS

The following detailed description set forth numerous specific details in order to provide a thorough understanding of the present invention. However, it will be understood by those skilled in the art that the present invention may be practiced without these specific details, while, in other instances, well known methods, procedures, components and circuits have not been described in detail so as not to obscure aspects of the present invention.

Figure 1:
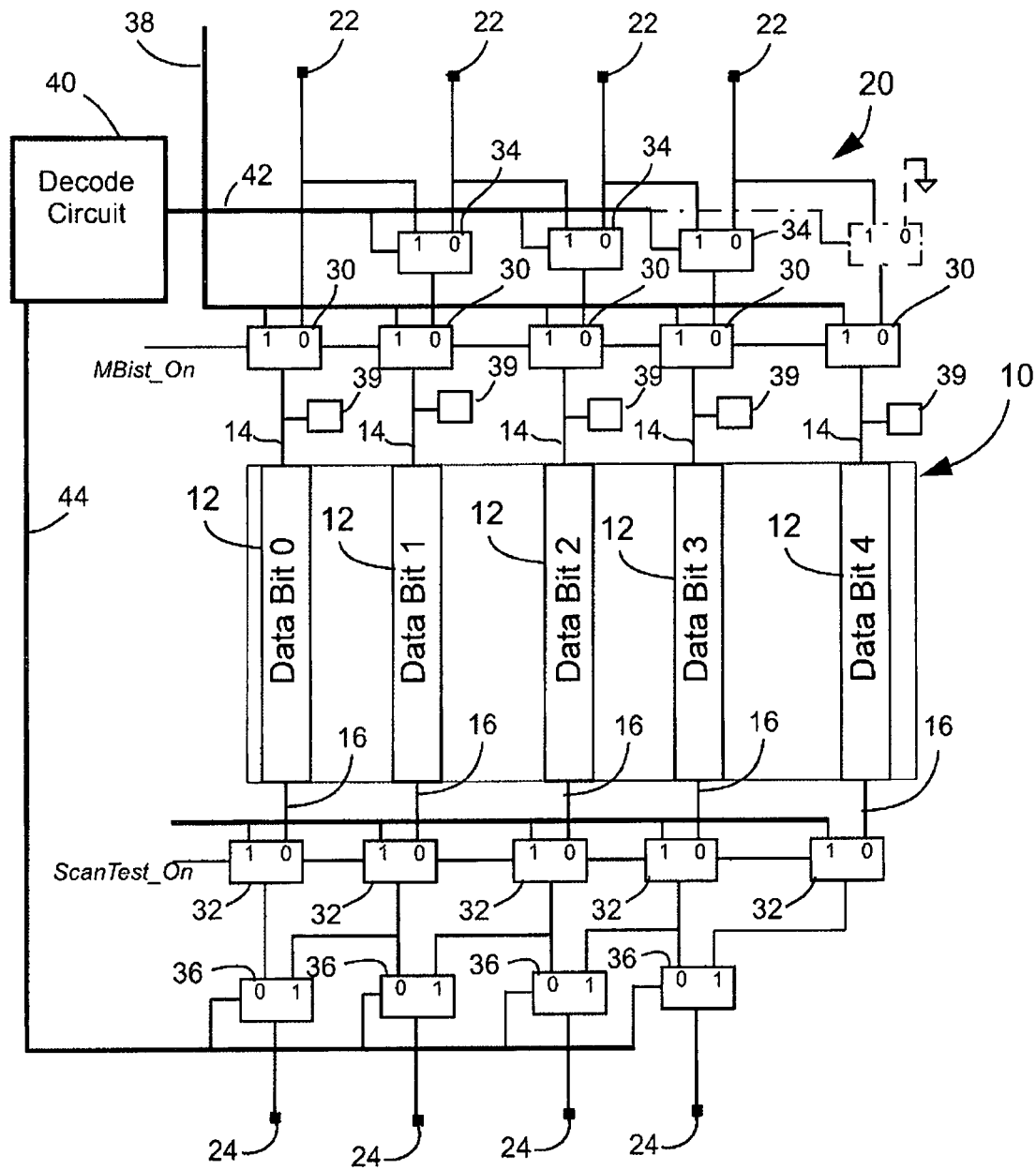
FIG. 1 is a diagrammatic view of a semiconductor memory array having one redundant data bit group and a memory collar for implementing I/O shifting according to a first embodiment of the present invention.

FIG. 1 illustrates an embodiment of a simple memory 10 according to the present invention. The memory includes a predetermined number of data bit groups 12 greater than the number of data bit groups required to store functional data words so as to provide one or more redundant data bit groups for repairing the memory. The data bit groups are also commonly referred to as IOs or I/O blocks and comprise at least one column bit line and typically include a plurality of column bit lines. For simplicity, FIG. 1 shows the memory 10 as having five data bit groups, including four non-redundant data bit groups for storing functional data words and one redundant data bit group. Each data bit group has a data input 14 and a data output 16. The memory may be arranged in a plurality of segments having a plurality of data bit groups, with each segment provided with one or more redundant data bit groups.

In general, all functional inputs, functional outputs and data bit groups (with associated memory inputs and outputs) are ordered from first to last. All functional inputs are associated with functional outputs by a corresponding functional input/output index, hereinafter referred to as I/O index, i.e., the first functional input is associated with the first functional output, the second functional input is associated to second functional output, etc. By default, each data bit group is associated with a functional input and a functional output of the same index, i.e., the first data bit group receives its data from the first functional input and provides data to the first functional output, and so on. Redundant data bit groups do not have corresponding functional inputs and outputs by default.

The present invention provides a memory collar 20 interposed between functional inputs 22 and data inputs 14 and between functional outputs 24 and data outputs 16. Memory collar 20 comprises input test selectors 30 and output test selectors 32 coupled to respective data bit group inputs and data bit group outputs, respectively, and input repair selectors 34 and output repair selectors 36 coupled between the input and output test selectors and the functional inputs and functional outputs, respectively. The selectors are in the form of multiplexers having a control input, two or more inputs and an output.

Input test selectors 30 are responsive to a memory test control signal, MBist_On, have one test input coupled to a memory BIST controller via a BIST data input bus 38, an output coupled to an associated data bit group input 14 and an input coupled to the output of an input repair selector 34. Output test selectors 32 are responsive to a scan test control signal, ScanTest_On, have a test input for scan test data, an input coupled to output 16 of an associated data bit group, and an output coupled to an input of an associated output repair selector 36. It will be seen that with the test selectors located proximate the memory inputs and outputs, i.e., interposed between the memory and the repair selectors, it is possible to completely test the repair selection circuitry using scan test methods.

Input repair selectors 34 selectively connect each functional input 22 to the input of a default data bit group 12 and to a number of adjacent data bit group inputs, equal to the number of redundant data bit groups, in the direction of increasing data bit group index, (i.e., toward the last data bit group), via input test selectors 30. Similarly, output repair selectors 36 selectively connect each functional output 24 to the output of a default data bit group and to the output of the same number of adjacent data bit group outputs, via the output test selectors. Thus, in the embodiment of FIG. 1, a memory having one redundant data bit group, each functional input is connected to a default input of each of one input repair selector and an alternate input of an adjacent input repair selector in the direction of increasing data bit group index. For a memory having two redundant data bit groups, as shown in FIG. 2, each functional input is applied to a default input of an input repair selector, and to first and second alternate inputs of two adjacent input repair selectors in the direction of increasing data bit group index. The same applies to the output repair selectors.

Observation circuitry 39 is coupled to the data input of each data bit group, in any manner well known in the art. Observation logic is used during the scan test to provide full testability of the input test selectors 30 and input repair selectors 34. Observation logic can consist of scannable memory elements or any other logic network whose output is monitored during the scan test. The present invention further provides a circuit 40, described later, for generating a respective control signal for each input and output repair selector and delivering the signals via control signal buses 42 and 44. Circuit 40 includes a register for storing a memory test result for each data bit group, including the redundant and non-redundant data bit groups.

Memory and Scan Tests

It will seen from the foregoing that a memory test is performed by setting the MBist_On active and applying test data to the test input of the input test selectors in accordance with a test algorithm. During a memory test, the ScanTest_On signal is inactive. Importantly, all data bit groups, including non-redundant and redundant data bit groups, can be tested and all defective data bit groups can be identified in a single pass, which means that it is also possible to determine whether the memory is non-repairable in the same single pass of a memory test. This is possible because the test selectors are coupled directly to the data inputs of the data bit groups interposed between the data bit groups and the input/output repair selectors. A data bit group memory test result is stored for each data bit group for use in repairing a memory having a number of defective data bit groups equal or less than the number of redundant data bit groups.

A scan test is performed by setting ScanTest_On active, and applying test data to the data inputs of-the output test selectors. Importantly, the above described architecture allows the input and output repair circuitry to both be fully tested in a conventional scan test. Since the repair method is applied each time power is applied to the circuit containing the memory (soft repair), it is very important that the repair selectors be completely tested at manufacturing time. This is because the repair configuration could change over the life of the circuit and be different from that used during manufacturing. Most other repair methods only test functionally one repair configuration by re-testing the repaired memory. Re-testing is costly in terms of test time and does not guarantee that the memory will be repairable in the future should a different repair configuration be needed.

Repair Method

In the presence of faulty data bit groups, the repair selector at the input of a given data bit group will select a functional input whose index is lower than its default functional input by a number determined by the number of faulty data bit groups in data bit groups having a lower index than that of the given data bit group. The control signal applied to the repair selector represents the difference or offset between the index of the data bit group and that of the functional input to be associated with the data bit group. A control signal of the same value, representing the same offset, is applied to the functional output repair selector connected to the functional output associated with the functional input.

The method of the present invention comprises performing a memory test of all data bit groups in the memory to identify all data bit groups having at least one defective data bit; storing a test result for each data bit group; and selecting a functional input for each data bit group and a data bit group output for each functional output based on the test result and a functional input and output index (I/O index).

I/O Shifting

In accordance with one embodiment of the method, generally referred to as I/O Shifting, the step of selecting a functional input and a data bit group output includes the steps of, for each data bit group in data bit group index sequence from first to last, and the I/O index being initially set to its value first, retrieving the data bit group test result and determining whether the data bit group is defective.

If the data bit group is not defective, a functional input for the data bit group, and a data bit group output for the functional output of the current I/O index, are selected corresponding to a current defective data bit group count and then incrementing the I/O index. The identity of the selected functional input and of the selected data bit group output for each data bit group are stored for use in driving corresponding input and output repair selectors. The identity could be associated with the actual functional input index which is the information stored for the I/O substitution embodiment, described below. In the I/O shifting embodiment of the present embodiment, only the offset is stored.

If the data bit group is defective, the defective data bit group count is incremented. Then, a determination is made as to whether the defective data bit group count exceeds the number of redundant data bit groups. If so, the memory is designated as non-repairable and the memory test is terminated.

The following table illustrates data obtained from test results for the memory shown in FIG. 2, which has seven non-redundant data bit groups, whose data bit group index ranges from are 0 through 6, and two spare or redundant data bit groups, whose data bit group indexes are 7 and 8. The test selectors have not been shown to simplify the figure and description. Data bit groups 2 and 5 are assumed to be defective for the purpose of illustration. In FIG. 2, each input repair selector has three inputs, including a default input, a first input for a functional input having an index value which is two less than that of the data bit group and an input for a functional input having an index value which is one less than that of the data bit group. The table shows the input repair selector and the output repair selector control signals as well as the functional input and the data bit group output selected by these control signals. The table also shows the current I/O index and the current defective data bit group count.

Since data bit groups 2 and 5 are defective, no selector controls are generated for them. However, both cause the defective data bit group count to incremented. Optionally, a selector control could be generated to select a "safe" input value for the data bit group, as shown in FIG. 3b. A safe value would be a constant value (0 or 1) which would minimize power consumption or coupling with other data bit groups. This optional safe input requires the addition of an input to the repair selector.

Since the data bit group of index 0 and 1 are not defective and the fault count is zero when they are processed, the functional inputs and data bit group outputs selected for them are simply their respective default values. The I/O index is increment twice from 0 to 1 and from 1 to 2, when they are processed.

When defective data group 2 is processed, the current number of defective data bit groups is incremented and checked for not exceeding the maximum. i.e., the number of redundant data bit groups. No input or output repair selector control signals were generated and the functional I/O index was not incremented.

When the data bit group with index 3 is processed, the fault count is 1 and the I/O index is 2. According to the present method, the functional input of the data bit group 3 corresponds to the fault count, i.e. 1. The same value, 1, is applied to the output repair selector connected to the functional output which corresponds to the I/O index. This is functional output 2, as shown in column 1 in Table 1.

When the data bit group 6 is processed, the current I/O index will be 4, having been incremented when groups 0, 1, 3 and 4 were processed, and the fault count will be 2. Thus, the input selector control of that group will be set to 2 to correspond to the fault count and the output select control of functional output 4 will be set to the same value, 2.

It will be seen that the method of the present invention considerably facilitates specifying input and output selector controls and the functional inputs and data bit group outputs corresponding thereto.

TABLE 1

| Data Bit Group Index | 0 | 1 | 2 | 3 | 4 | 5 | 6 | 7 | 8 |
|---|---|---|---|---|---|---|---|---|---|
| Test Results | g | g | b | g | g | b | g | g | g |
| Input Mux. Control | 0 | 0 | x | 1 | 1 | x | 2 | 2 | 2 |
| Functional Input | 0 | 1 | x | 2 | 3 | x | 4 | 5 | 6 |
| Output Mux. Control | 0 | 0 | 1 | 1 | 2 | 2 | 2 | — | — |
| Data Bit Group Output | 0 | 1 | 3 | 4 | 6 | 7 | 8 | — | — |
| Fault Count | 0 | 0 | 1 | 1 | 1 | 2 | 2 | 2 | 2 |
| I/O Index | 0 | 1 | 1 | 2 | 3 | 3 | 4 | 5 | 6 |

Figure 3A:
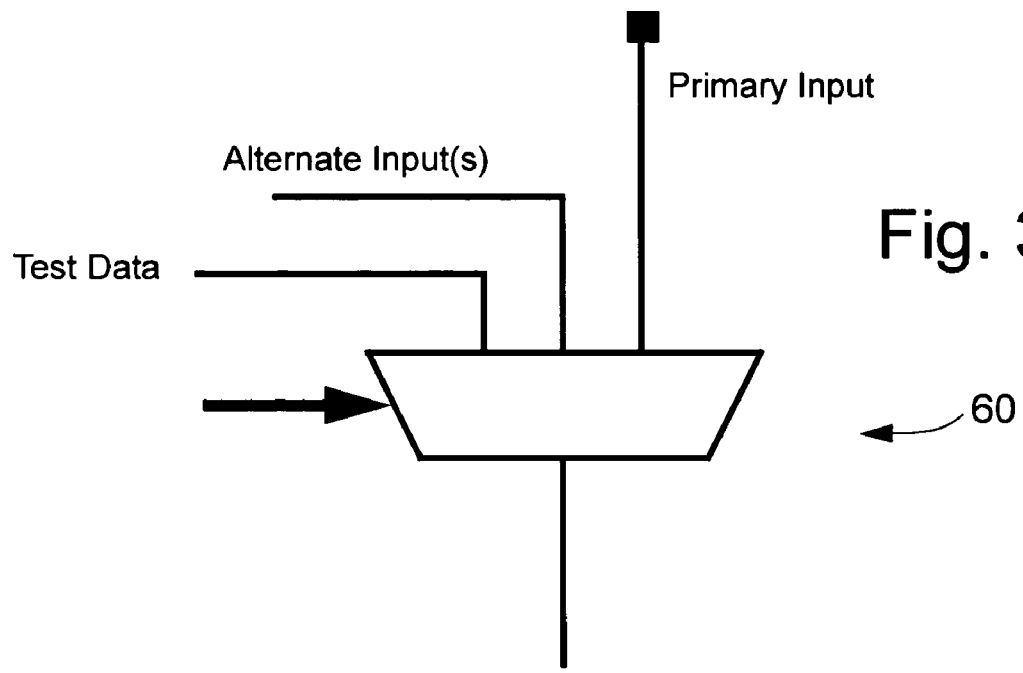
FIG. 3a is a diagrammatic view of memory collar selector or multiplexer which is a combined test selector and repair selector and FIG. 3b is a view which illustrates a selector having a "safe" value input, according to an embodiment of the present invention.
Figure 3B:
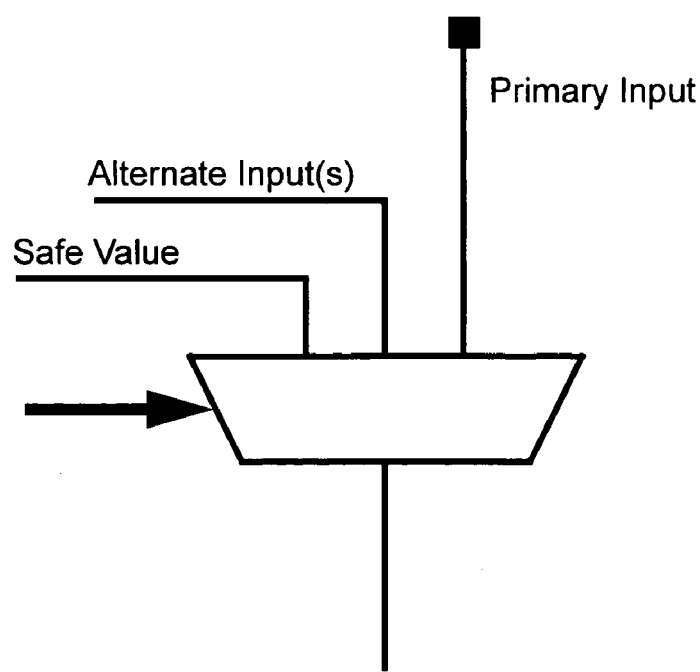

Test Results:
g—good
b—bad
Selector Controls:
0—default input
1—first adjacent functional input or data bit group output
2—second adjacent functional input or data bit group output As shown in FIG. 3, the test selectors and repair selectors can be combined into a single multiplexer 60 each having a test input and an appropriate number of functional inputs or data bit group outputs as previously described and an output connected to a data bit group input or a functional output. However, to maximize fault coverage, it is preferred that the output test selectors and output repair selectors be maintained as separate levels of multiplexers.

I/O Substitution

Figure 4:
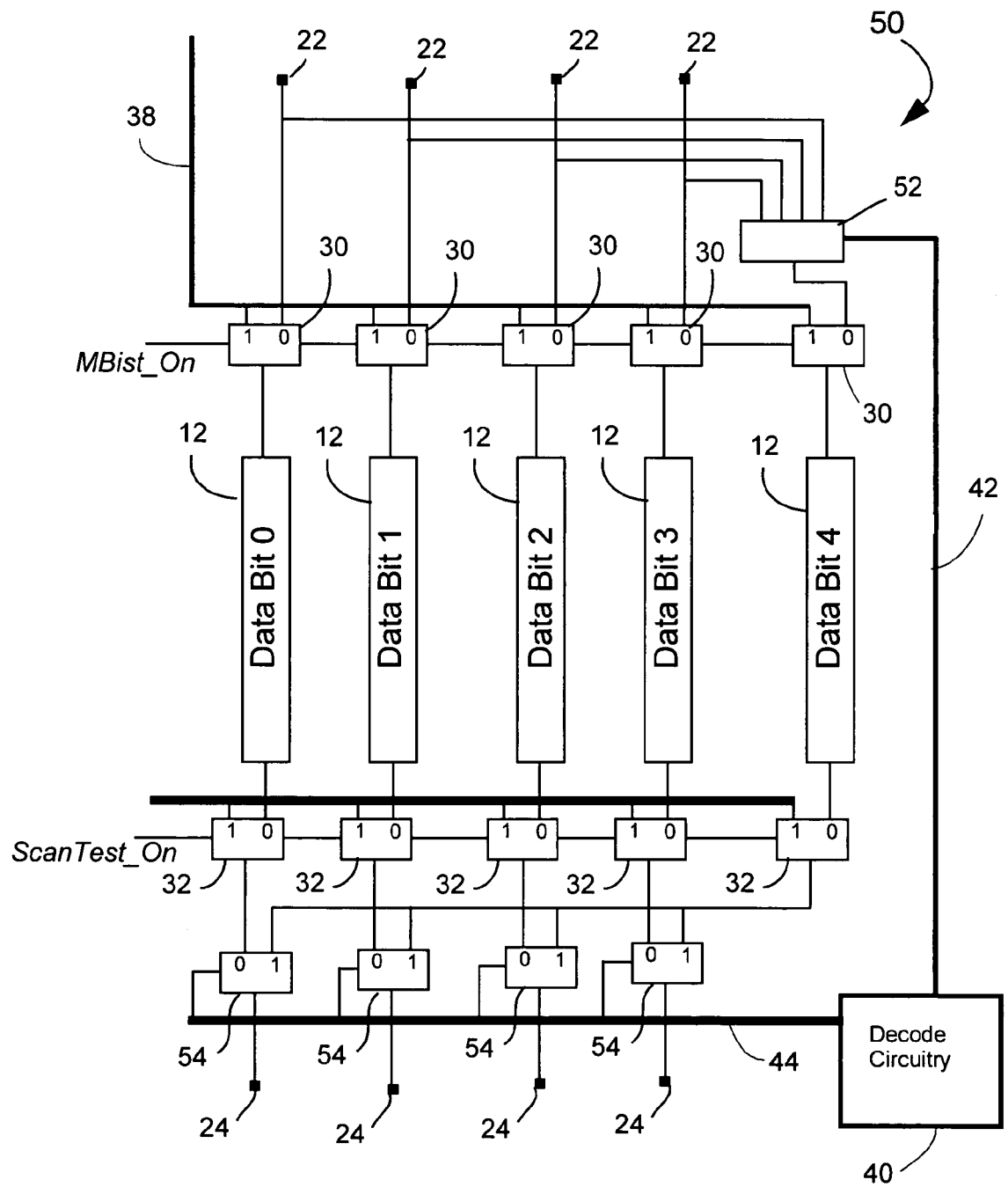
FIG. 4 is a diagrammatic view of a semiconductor memory array and a memory collar for implementing I/O substitution in accordance with an embodiment of the present invention in which input repair selectors are provided only for redundant data bit groups and output repair selectors select between the output of a data bit group and the output of each of the redundant data bit group.

In another embodiment 50 of the present invention, generally referred to as I/O substitution and illustrated in FIG. 4, which includes memory 10 having five data bit groups 12 including four non-redundant data bit groups and one redundant data bit group. An input repair selector 52 is provided only for a redundant data bit group and each is provided with an input for each of the functional inputs 22. The non-redundant data bit groups are not provided with an input repair selector, but are provided with input test selectors 30, as in the previously described embodiments. Optionally, a multiplexer could be added to select between the functional input and a safe value. An output repair selector 54 is provided to drive each functional output 24. Each of the output repair selectors has an input for the output of an output test selector 32, which in non-test mode, is a data bit group output, and an input for the data output of each of the redundant data bit groups.

The method in this embodiment involves, for each non-redundant data bit group in data bit group index sequence from first to last, retrieving the data bit group test result and determining whether the data bit group is defective. If the data bit group is not defective, data input and data output of the data bit group are connected to their default functional input and default functional output, respectively. If the data bit group is defective, a defective data bit group count is incremented and the default functional input and default functional output of the defective data bit group to the data input and data output, respectively, are connected of a non-defective redundant data bit group. Further, if the defective data bit group count exceeds the number of non-defective redundant data bit groups, the memory is designated as non-repairable.

The method of the present invention provides several advantages over the conventional self-repair methods. First, it provides higher test coverage of both the memory array and repair circuitry. In the array, additional coupling faults with spare cells are covered. The repair circuitry is completely tested as part of the scan test process. Second, non-repairable memories are identified in a single test step as opposed to two required in conventional methods, thus reducing test time. Third, the method provides the ability to use embedded test logic, in the form of embedded multiplexers, inside the memory. This reduces the performance impact when self-repair is used.

Control Signal Generating Circuit

Figure 5:
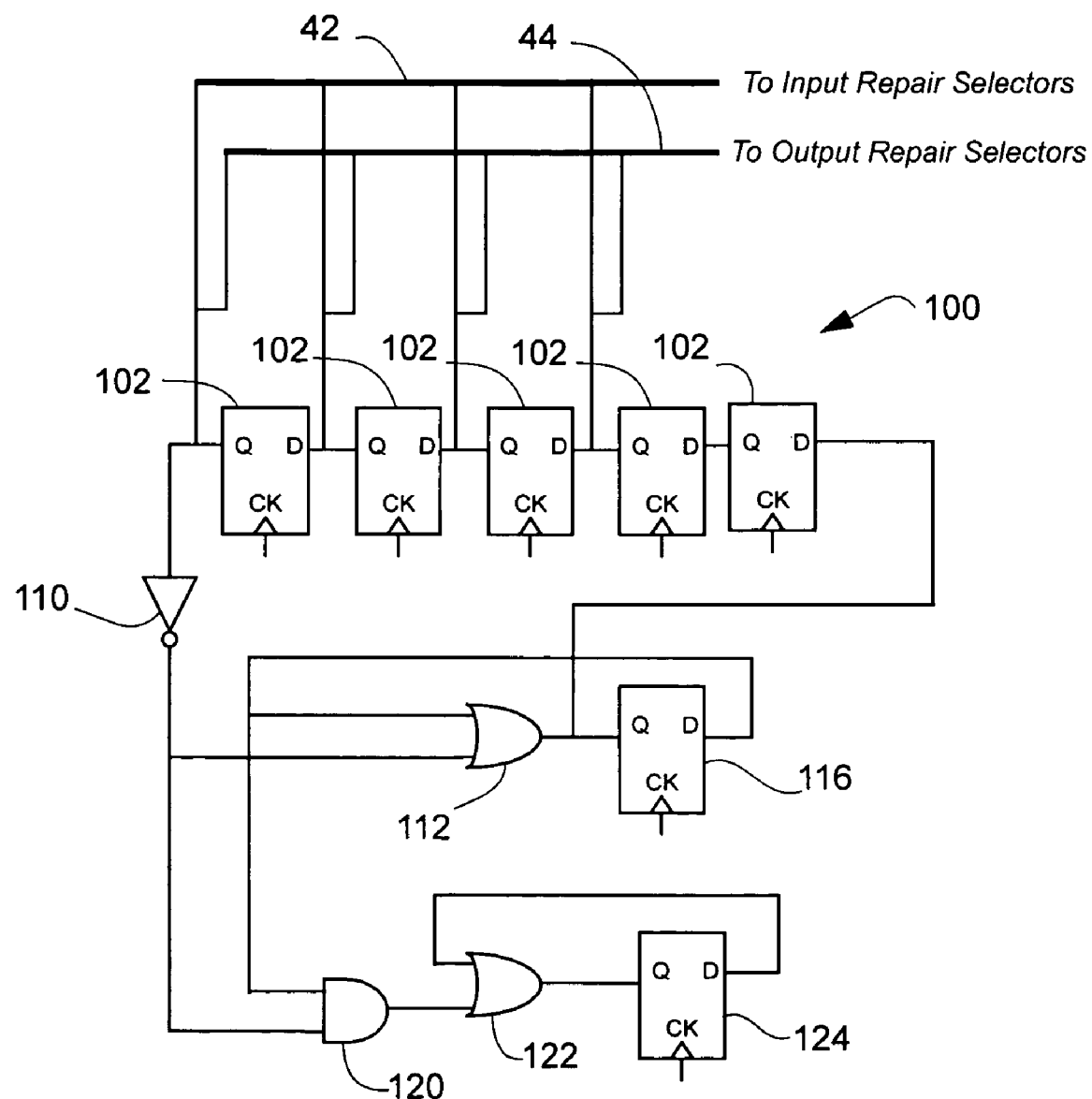
FIG. 5 is a diagrammatic view of a circuit for generating self-repair multiplexer control signals according to an embodiment of the present invention.

FIG. 5 illustrates a preferred embodiment of circuit 40 for generating repair selector control signals for the embodiment of FIG. 1. The circuit includes a shift register 100 having a bit 102 corresponding to each data bit group for storing a data bit group test result. Bits 102 store a logic 1 for a non-defective data bit group and a logic 0 for a defective data bit group having at least one defective bit. The output of each bit 102 is connected to the control input of a repair output selector with the corresponding index, and to the control input of its corresponding input repair selector, with an index number that is higher by one, thus forming two repair selector control buses, one bus connected to the input repair selectors and one bus connected to the output repair selectors. Shift register 100 has a serial input 104 and a serial output 106.

Output 106 of the shift register is connected to an inverter 110 which, in turn, is connected to one input of an OR gate 112. The output of the OR gate is connected to serial input 104 of shift register 100 and to the input of a flip-flop 116, whose output is connected the other input of OR gate 112. The OR gate and flip-flop form a circuit which operates to detect the first defective data bit group (logic 0) and then force the value of each following test result value to a logic 1, and feed the value into the input of the shift register. As mentioned above, the processed test result values are output as a bus and applied to the control inputs of the input and output self-repair selectors.

By way of example, if the initial test result bits is 11011, the bit values after processing would be 00111. The logic 1 values will cause the functional values applied to the data bit group values to be shifted by one data bit value toward the redundant data bit group and to skip the defective data bit group.

A second sub-circuit, which includes an AND gate 120, an OR gate 122 and a flip-flop 124, determines whether the memory is repairable or non-repairable. The inverted serial output of shift register 100 is fed to one input of AND gate 120 which also receives the output of first mentioned flip-flop 116. The output of the AND gate is applied to one input of OR gate 122 whose output is applied to the input of second flip-flop 124, which is connected to the other input of OR gate 122. The output of the flip-flop 124 becomes active when a predetermined number of defective data bit groups, which exceeds the number of redundant data bit groups, have been detected. In this example, the output becomes active if two or more defective data bit groups are detected. The shift register and flops 116 and 124 operate under control of a clock signal.

It will be understood by those skilled in the art that the above described circuit can be readily modified to detect more than one defective data bit group so that more than one redundant data bit group may be provided.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of repairing a semiconductor memory having a number of data bit groups greater than that required to store functional data words so as to provide one or more redundant data bit groups for repairing said memory, each data bit group having a data input and a data output, and non-redundant data bit groups having a default functional input and a default functional output, said method comprising:

prior to performing a memory test, inserting into a circuit containing said memory, an input test selector connected to the data bit input of each data bit group and an output test selector connected to the data bit output of each data bit group and inserting input repair selectors between functional inputs and said input test selectors and output repair selectors between said output test selectors and functional outputs;

performing a memory test of all data bit groups in said memory to identify all data bit groups having at least one defective data bit;

storing a test result for each data bit group; and selecting a functional input for each data bit group and a data bit group for each functional output based on said test result and a functional input and output index (I/O index).

2. A method as defined in claim 1, said selecting a functional input and a functional output including the steps of:

for each data bit group in data bit group index sequence from first to last:
retrieving the data bit group test result;
if the data bit group is not defective:
selecting a functional input for the data bit group and a data bit group for the functional output of the current I/O index corresponding to a current defective data bit group count; and
incrementing the I/O index;
if the data bit group is defective:
incrementing a defective data bit group count; and
designating the memory as non-repairable if the defective data bit group count exceeds the number of redundant data bit groups.

3. A method as defined claim 1, further including storing the identity of the selected functional input and of the selected data bit group for each data bit group.

4. A method as defined in claim 1, said selecting a functional input and a functional output including connecting the default functional input and default functional output of a defective data bit group to the data input and data output, respectively, of a redundant data bit group.

5. A method as defined in claim 1, for each non-redundant data bit group in data bit group index sequence from first to last:
retrieving the data bit group test result;
if the data bit group is not defective;
connecting the data input and data output of the data bit group to its default functional input and default functional output;
if the data bit group is defective:
incrementing a defective data bit group count;
connecting the default functional input and default functional output of the defective data bit group to the data input and data output, respectively, of a non-defective redundant data bit group; and
if the defective data bit group count exceeds the number of non-defective redundant data bit groups, designating the memory as non-repairable.

6. A method as defined in any of claims 2-5, further including performing a scan test of logic connected to said memory to test said logic and selector circuitry connecting said memory to said logic.

7. A self-repair circuit for a semiconductor memory having a number of data bit groups greater than that required to store functional data words to provide redundant data bit groups for repairing said memory, each data bit group having a data input and a data output, and non-redundant data bit groups having a default functional input and a default functional output, said circuit comprising:

input and output test selectors coupled to respective data bit group inputs and outputs, respectively;

input and output repair selectors coupled between said input and output test selectors and functional inputs and functional outputs, respectively;

said input test selectors being responsive to a memory test control signal, and each having an output coupled to an associated data bit group input and to outputs of associated input repair selectors;

said output test selectors being responsive to a scan test control signal, and being coupled to associated data bit group output and to associated output repair selectors;

said input repair selectors selectively connecting each functional input to a default data bit group input and to a number of adjacent data bit group inputs equal to the number of redundant data bit groups via said input test selectors;

said output repair selectors selectively connecting each functional output to a default data bit group output and to said number of adjacent data bit group outputs via said output test selectors.

8. A circuit as defined in claim 7, said test selectors and said repair selectors being combined to provide an input selector for each data bit group and an output selector for the output of each data bit group, each input selector having a test input, a default functional input, and alternate functional inputs corresponding to the number of redundant of data bit groups, and each output selector having a test input, an input for a default data bit group output, and inputs for alternate data bit group outputs corresponding to the number of redundant of data bit groups.

9. A circuit as defined in claim 7, further including a circuit for generating said repair selector control signals.

10. A circuit as defined in claim 9, said circuit generating repair selector control signals including:

a test result storage register having a memory element for each data bit group for storing a test result of said data bit group;

a control signal storage register for storing a repair control signal for each said input and output repair selector; and a state machine coupled to said test result storage register for retrieving test result data, generating said repair selector control signals, storing generated repair selector control signals and determining whether said memory is non-repairable.

11. A circuit as defined in claim 9, said circuit for generating said repair selector control signals being operable to:
for each data bit group in data bit group index sequence from first to last and for an 1/0 index initially set to first:
retrieving the data bit group test result;
if the data bit group is not defective:
selecting a functional input for the data bit group and a data bit group for functional output for the data bit group of the current 1/0 index corresponding to a current defective data bit group count; and
incrementing the 1/0 index;
if the data bit group is defective:
incrementing a defective data bit group count; and
designating the memory as non-repairable if the defective data bit group count exceeds the number of redundant data bit groups; and
incrementing the data bit group index.

12. A circuit as defined in claim 9, said circuit for generating said repair selector control signals being operable to connect the default functional input and default functional output of a defective data bit group to the data input and data output, respectively, of a redundant data bit group.

13. A circuit as defined in claim 12, further including:
said input repair selectors comprising a functional input selector for each redundant data bit group, each having an input for each functional input,
said output repair selectors comprising a selector for each data bit group output, each having an input for a corresponding data bit group output and an input for a redundant data bit group and an output coupled to a functional output.

14. A circuit as defined in claim 9, said circuit for generating said repair selector control signals being operable to, for each non-redundant data bit group in data bit group index sequence from first to last:
retrieve the data bit group test result;
if the data bit group is not defective;
generate control signals to connect the data input and data output of the data bit group to its default functional input and default functional output; and
if the data bit group is defective:
increment a defective data bit group count;
connect the default functional input and default functional output of the defective data bit group to the data input and data output, respectively, of a non-defective redundant data bit group; and
if the defective data bit group count exceeds the number of non-defective redundant data bit groups, designate the memory as non-repairable.

15. A circuit as defined in claim 9, said functional inputs, functional outputs and data bit groups being ordered from first to last, each functional input being associated with a corresponding functional output of the same 1/0 index, said circuit further including a state machine for generating control signals for said input and output repair selectors from a stored data bit group test result for each data bit group, comprising:
first storage means for storing data bit group test results;
second storage means for storing control signals;
a defective data bit group counter for counting defective data bit groups; said state machine being operable to for each data bit group in data bit group index increasing order:
retrieve the data bit group test result, and
if the data bit group is not defective, set the control signal of the input repair selector associated with the current data bit group index and the control signal of the output repair selector associated with the current I/O index to the current number of defective data bit groups; and increment the I/O index;
if the data bit group is defective, increment the defective data bit group counter and, if the current number of defective data bit groups exceeds the number of redundant data bit groups, declaring the memory non-repairable.

16. A circuit as defined in claim 15, further including, if data bit group is faulty, setting the control signal of the input repair selector associated with the current data bit group index to select a safe value.

17. A circuit as defined in claim 7, said memory being arranged in a plurality of segments each having an equal number of data bit groups and one redundant data bit group per segment.

18. A circuit as defined in claim 7, wherein the number of redundant data bit groups is greater than one, said memory comprises a predetermined number of data bit groups, further including:
said input repair selectors selectively connecting each functional input to a default memory input and to a number of adjacent memory inputs in the direction of a last data bit group equal to the number of redundant data bit groups;
said output repair selectors selectively connecting each functional output to a default memory output and to the predetermined number of adjacent memory outputs in a direction of the last data bit group; and
a control signal generating circuit for generating a control signal for each repair selector driving a memory input and each repair selector driving a functional output.

* * * * *